United States Patent
Schwartz et al.

(10) Patent No.: US 7,194,390 B1
(45) Date of Patent: *Mar. 20, 2007

(54) PREDICTOR OF MINIMAL NOISE FIGURE FOR WIDEBAND AMPLIFIER

(75) Inventors: David F. Schwartz, San Diego, CA (US); Jeffery C. Allen, San Diego, CA (US); J. William Helton, Del Mar, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 313 days.

This patent is subject to a terminal disclaimer.

(21) Appl. No.: 10/459,162

(22) Filed: Jun. 11, 2003

Related U.S. Application Data

(63) Continuation-in-part of application No. 10/157,413, filed on May 29, 2002, now Pat. No. 7,058,555, which is a continuation-in-part of application No. 09/540,438, filed on Mar. 31, 2000, now Pat. No. 6,622,092.

(51) Int. Cl.
*G06F 17/50* (2006.01)
*G01S 15/60* (2006.01)

(52) U.S. Cl. .......................... 703/2; 703/14; 702/117; 330/54; 333/193; 367/89; 367/152

(58) Field of Classification Search ................ 703/2, 703/14; 702/117; 367/89, 152; 330/54; 333/193
See application file for complete search history.

(56) References Cited

U.S. PATENT DOCUMENTS

| | | | | |
|---|---|---|---|---|
| 4,992,752 A | * | 2/1991 | Cioffi | 330/54 |
| 5,047,725 A | * | 9/1991 | Strid et al. | 324/601 |
| 5,121,063 A | * | 6/1992 | Kerkow et al. | 324/601 |
| 5,311,140 A | * | 5/1994 | Permuy | 324/680 |
| 5,334,960 A | * | 8/1994 | Penunuri | 333/193 |
| 5,422,860 A | * | 6/1995 | Bradley et al. | 367/89 |
| 5,436,846 A | * | 7/1995 | Fleming-Dahl | 716/4 |
| 5,557,637 A | * | 9/1996 | Glynn | 375/271 |
| 5,621,331 A | * | 4/1997 | Smith et al. | 324/645 |
| 5,708,587 A | * | 1/1998 | Franck et al. | 716/3 |
| 5,793,640 A | * | 8/1998 | Wu et al. | 702/65 |
| 5,794,008 A | * | 8/1998 | Meyers et al. | 716/4 |

* cited by examiner

*Primary Examiner*—Thai Phan
(74) *Attorney, Agent, or Firm*—Peter A. Lipovsky; Michael A. Kagan; Allan Y. Lee

(57) ABSTRACT

A predictor allows the computation of the greatest lower bound of the noise figure pertaining uniformly over the operating band of a wideband amplifier. This computation is done directly from noise-parameter data of the amplifier.

7 Claims, 2 Drawing Sheets

PREDICTOR OF MINIMAL NOISE FIGURE FOR WIDEBAND AMPLIFIER

CROSS-REFERENCE TO RELATED APPLICATIONS

This application is a continuation-in-part of commonly assigned U.S. patent application Ser. No. 10/157,413 filed 29 May 2002 now U.S. Pat. No. 7,058,555, which is a continuation-in-part of commonly assigned U.S. patent application Ser. No. 09/540,438 filed 31 Mar. 2000 now U.S. Pat. No. 6,622,092. These related applications are incorporated by reference herein.

BACKGROUND

This invention relates generally to methods for estimating the minimal noise figure for a wideband amplifier. More specifically, but without limitation thereto, the invention relates to a computer program that computes the greatest lower bound of the noise figure that exists uniformly over the operating band of a given amplifier utilizing a loss-less matching network.

A common problem in electrical engineering is the amplification of a signal. Aside from increasing the power level of the signal, a common goal in the design of an amplifier is to minimize the noise in the amplified signal. The parameter describing the noise contributed by the amplifier is known as the "noise figure" (F). For any given amplifier, F can be defined as "the ratio of the available signal-to-noise power ratio at the input to the available signal-to-noise power ratio at the output". (G. Gonzalez, "Microwave Transistor Amplifiers", page 296, Second Edition)

To improve the performance of a two-port amplifier, a "matching" network connecting a signal generator to the amplifier may be used. Ideally, the matching networks can simultaneously maximize transducer power gain and minimize the F of the amplifier while maintaining stability. In practice, maximizing gain and minimizing F are competing objectives. If the signal is narrowband, standard methods allow a matching network to realize the minimum F. If however the signal is wideband, there are no known methods that minimize F uniformly over the operating band.

There is a need in the art to be able to ascertain, for a given wideband amplifier, the greatest lower bound of the noise figure that pertains uniformly over the operating band of the amplifier.

SUMMARY

The invention allows the computation of the greatest lower bound of the noise figure pertaining uniformly over the operating band of a wideband amplifier. This computation is done directly from the noise-parameter data of the amplifier.

An object of the invention is to compute the greatest lower bound of the noise figure pertaining uniformly over the operating band of a wideband amplifier.

Still another object of the invention is to compute the greatest lower bound of the noise figure pertaining uniformly over the operating band of a wideband amplifier to allow design engineers to decide whether design objectives for gain and noise figure for a given amplifier can be attained.

Yet another object of the invention is to compute the greatest lower bound of the noise figure pertaining uniformly over the operating band of a wideband amplifier to provide a benchmark to grade the performance of proposed networks.

Still another object of the invention is to compute the greatest lower bound of the noise figure pertaining uniformly over the operating band of a wideband amplifier to permit evaluation of amplifier trade-offs such as gain, noise-figure, and operating band.

Other objects, advantages and features of the invention will become apparent from the following description when taken in conjunction with the accompanying drawing.

DESCRIPTION

Figure 1:
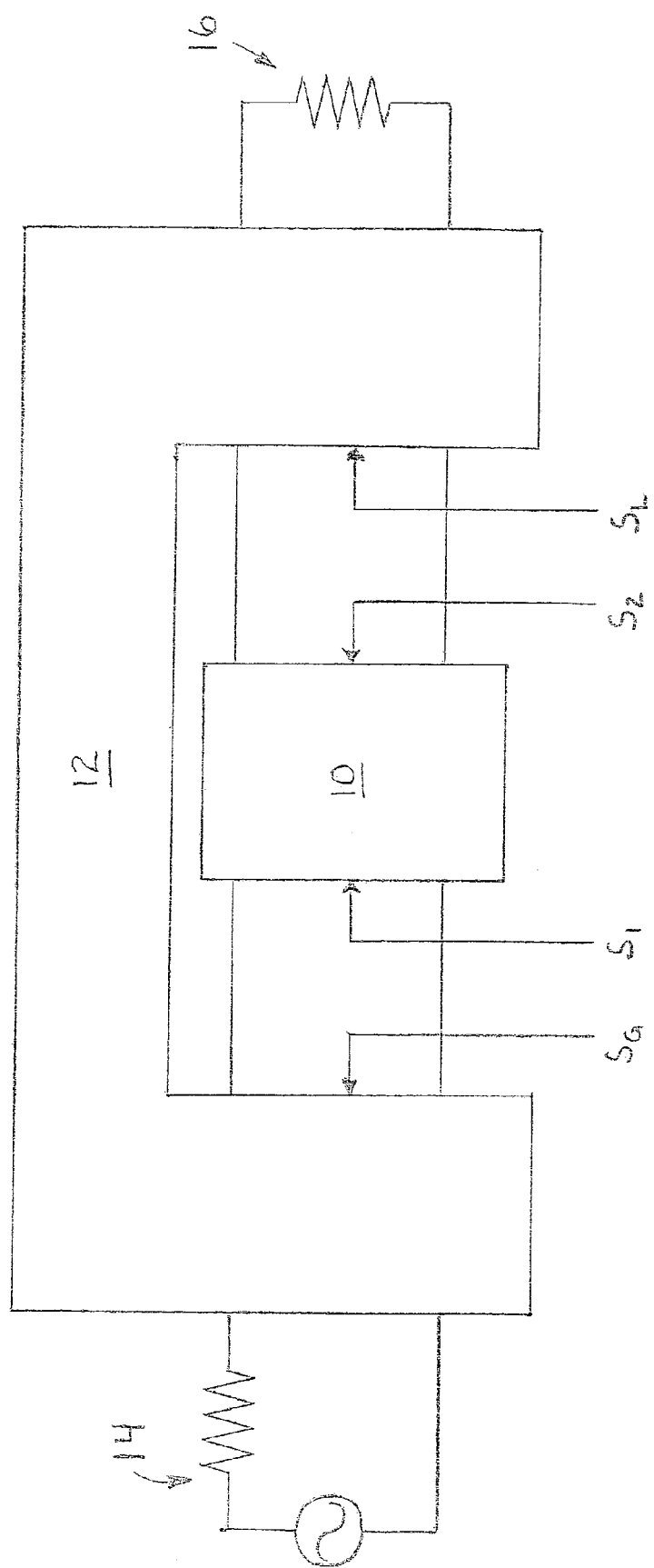
FIG. 1 is a diagramatic view illustrating a wideband amplifier and accompanying matching circuit.

Referring to FIG. 1, there is shown a setup that includes a given wideband amplifier 10, an arbitrary input matching network 12, and a signal generator source with zero reflectance 14. A zero reflectance load 16 is also shown. Such a load may be a 50 Ohm transmission line but other loads are of course possible. FIG. 1 illustrates the use of a single matching network. A common configuration of connecting a wideband amplifier to a transmission line is through the use of two matching networks, however the figure shows the essential of the two matching networks as a single matching network wherein both "sides" of the networks are connected together. In this figure, $S_1$ is signal power input 1 into amplifier 10, $S_2$ is signal power input 2 into amplifier 10, $S_G$ is signal power towards signal generator source 14 and $S_1$ is signal power towards load 16.

The invention makes it is possible to compute the greatest lower bound of the noise figure F applying uniformly over the operating band of a given amplifier (wherein the amplifier is operably coupled to an arbitrary matching network). This computation is made directly from measured noise-parameters of the amplifier.

Figure 2:
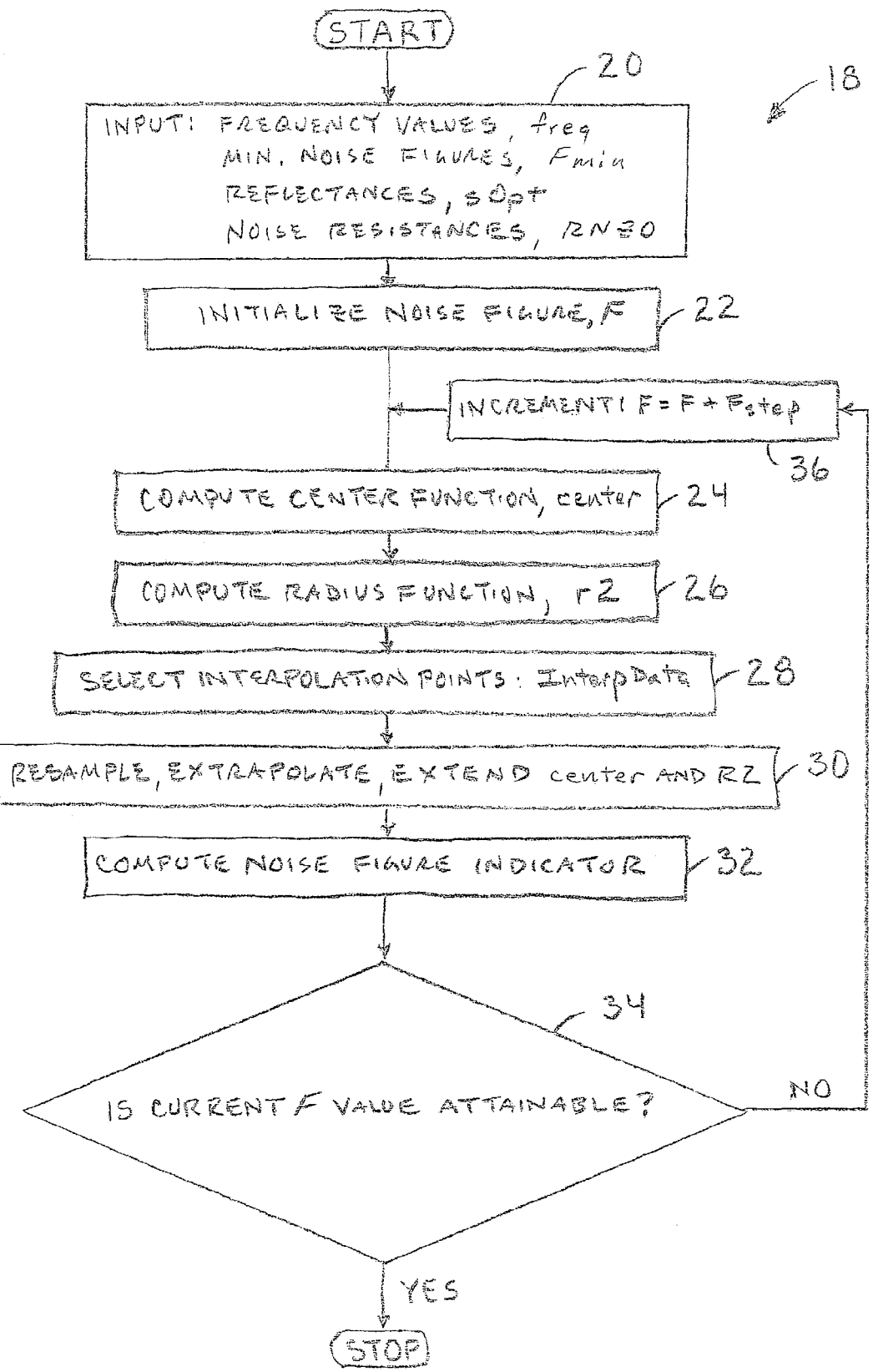
FIG. 2 is a flow chart of an exemplary computer process as may be used in accordance with the invention.

FIG. 2 is a flow chart of an example computer program 18 for computing the noise figure F corresponding to a system employing an optimum matching circuit connecting a given amplifier to a constant resistance signal generating source operating over a continuous frequency band. This program incorporates Nehari's Theorem as a performance disk, such as is described in: Helton, J. W. & O. Merino [1998] *Classical Control Using H<sup>∞</sup> Methods: Theory, Optimization, and Design*, Society for Industrial and Applied Mathematics.

Step 20 of this program inputs frequency values freq, which are the frequencies at which the noise parameters are measured; Fmin, which are the values of the minimum noise figure at each of the corresponding frequency values freq; sOpt, which are the source reflectance values for achieving the minimum noise figure at the corresponding frequency values freq; and RNZ0, which is the noise resistance measured by reading the noise figure F with zero source reflectance. These values are provided via the amplifier manufacturer's specification sheet. The value of RNZ0 is typically provided indirectly by amplifier manufacturers in the nature of RN/50, which is RN corresponding to a 50 Ohm impedance. The value RNZ0 can be readily converted from RN/50 as described in the G. Gonzalez reference identified above.

An example of a manufacturer's specification sheet is given in Table 1. This sheet is for an NE321000 amplifier and has been provided by this amplifier's manufacturer, NEC.

TABLE 1

NE321000
Data Sheet P14270EJ2V0DS00 5
NOISE PARAMETERS
VDS = 2 V, ID + 10 mA

| Freq. (Ghz) | Nfmin. (dB) | Ga (dB) | MAG./ANG. (deg.) | Rn/50 |
|---|---|---|---|---|
| 2.0 | 0.21 | 19.5 | 0.94/3.7 | 0.31 |
| 4.0 | 0.22 | 17.6 | 0.87/8.2 | 0.31 |
| 6.0 | 0.24 | 15.0 | 0.82/13.3 | 0.32 |
| 8.0 | 0.26 | 14.6 | 0.77/18.8 | 0.32 |
| 10.0 | 0.28 | 13.5 | 0.73/24.8 | 0.32 |
| 12.0 | 0.31 | 12.7 | 0.69/31.4 | 0.31 |
| 14.0 | 0.38 | 12.1 | 0.67/38.4 | 0.31 |
| 16.0 | 0.45 | 11.6 | 0.64/45.9 | 0.30 |
| 18.0 | 0.52 | 11.3 | 0.63/53.9 | 0.29 |
| 20.0 | 0.59 | 11.2 | 0.62/62.4 | 0.28 |
| 22.0 | 0.66 | 11.1 | 0.61/71.4 | 0.27 |
| 24.0 | 0.72 | 11.2 | 0.62/80.8 | 0.25 |
| 26.0 | 0.79 | 11.2 | 0.63/90.8 | 0.23 |

The value of complex number sOpt is taken from the magnitude (MAG./ANG.) column of the manufacturer's specifications.

The program also allows for the input of a desired frequency resolution parameter Nfc. As an example, for high fidelity, the parameter Nfc can be set to 1024. For simplicity of implementation, Nfc is assumed to be a power of two such as 256, 512, and 1024, for example.

Step 22 sets an estimated minimal attainable noise figure. The smallest this can be is the largest of the Fmin as provided by the amplifier's specification sheet. Step 22 sets this initial noise figure (F) to this value. Step 22 also initializes a frequency grid upon which computations will be made.

At step 24 a function center is computed that corresponds to the center of a disk defined by noise parameters Fmin, sOpt, and RNZ0.

At step 26 a radius function r2 is computed that corresponds to the square of the radius of the disk defined by the noise parameters Fmin, sOpt, and RNZ0.

At step 28, interpolation points InterpData are selected for all maximum Fmin values, one interpolation point is selected if there is only one maximum Fmin value.

At step 30, center and r2 are resampled over the frequency grid defined by Nfc and the operating frequency band, extended to include negative frequencies and extrapolated to smooth end points at infinity.

In step 32, an indicator ///Hk/// (Hankel Norm) corresponding to the proposed value of F is computed.

In step 34, a determination is made as to whether the calculated F is the greatest lower bound of the noise figure. In an embodiment of the invention this is mathematically equivalent to determining whether a reflectance function exists within the disk in function space whose center is given by center and whose radius squared is r2. If so, the current estimate of the F is output as maximum attainable. Otherwise F is incremented at step 36 by an amount Fstep, chosen by the user according to computational limits, and accuracy desired and the precision of the input data, for example, 0.001. The proposed value of quantity F is then re-computed. Processing then continues from step 24.

The following is an exemplary computer program that may be used to perform the above steps. This program is in the programming language known as MATLAB and is identified as a function titled "NFopt". Within this program the reflectance function is defined to be a function analytic on the right half of the complex plane (extended to include the imaginary axis), conjugate-symmetric across the real axis, and bounded in magnitude by one.

```
% Step 20 is performed as follows:
% Get the amplifier data
[freq, f0, Fmin, sOpt, RNZ0];
Nf = length(freq);
disp(['Number of frequency samples =', num2str(Nf)])
Nso = 256;
Nsmps_out = input(['Enter number of samples to compute, default =',int2str(Nso),'>']);
if isempty(Nsmps_out), Nsmps_out = Nso; end
Nfc = 2^nextpow2(Nsmps_out);      % length of freq_grid to be constructed
    % Step 22 is performed as follows:
%Nfp = ((F - Fmin(ip)) / (4*RNZ0(ip))) * abs(1 + sOpt(ip))^2;
F0inc = 0.002;
Fstep = 0.001;
F = max(Fmin) + F0inc;
normHankel = 1111;
% Obtain frequency grid corresponding to equal spacing on the circle.
% This grid maps z=i to omega=fmax.
[freq_grid] = jwgrid(Nfc, freq(end));
    % Step 24 is performed as follows:
Nfp = ((F - Fmin) ./ (4*RNZ0)) .* abs(1 + sOpt).^2;
center = sOpt ./ (1 + Nfp);
center = center(ifreq);
    % Step 26 is performed as follows:
% Rn = sqrt(Nfp.*(Nfp + 1 - abs(sOpt).^2)) ./ (1 + Nfp);
Nfp = ((F - Fmin) ./ (4*RNZ0)) .* abs(1 + sOpt).^2;
r2 = (Nfp.*(Nfp + 1 - abs(sOpt).^2)) ./ (1 + Nfp).^2;
r2 = r2(ifreq);
    % Step 28 is performed as follows:
% Choose interpolation points
imin = find(r2 == min(r2));
```

-continued

```
InterpData = [freq(imin) center(imin)];
    % Step 30 is performed as follows:
% Build center function, magnitude bounded by 1, extrapolating to 0.
% Extend center function outside BW
cmax = 0.99; c0 = 0;
fstart = freq_grid(find(freq_grid < freq(1)));
ftail = freq_grid(find(freq_grid > freq(end)));
Ntail = length(ftail);
Ntailstep = ceil(min(20,.1*Ntail));
cstart = c0+(center(1)−c0)*StepSpline(fstart(1),fstart(end),fstart,'up');
ctail = c0 + (center(end) − c0)* . . .
    StepSpline(ftail(fix(Ntailstep/4)),ftail(2*Ntailstep),ftail,'down');
center = InExSpline(. . .
    [fstart; freq; ftail], . . .
    [cstart; center; ctail], freq_grid, 0, 0);
ic = find(abs(center) > cmax);
center(ic) = cmax * center(ic) ./ abs(center(ic));
% Extend radius^2 function, r2.
r2min = min(r2);
r2max = .99;
Nsteps = nextpow2(Nsmps_out);
r2_0=r2max; r2_infty = r2max;
r2ave1 = (r2_0 + r2(1))/2; r2ave2 = (r2_infty + r2(end))/2;
finc = .1*min(diff(freq));
% hyperbolic fit on tails
Ntflat = Nsteps;
r2tail = r2(end)+(r2_infty − r2(end))* . . .
    StepSpline(ftail(fix(Ntailstep/4)),ftail(2*Ntailstep),ftail,'up');
Nsflat = min(length(fstart)−1,Nsteps);
r2start = r2(1)+(r2_0 − r2(1))*StepSpline(fstart(1),fstart(end),fstart,'down');
r2 = InExSpline(. . .
    [fstart(:);freq;ftail(:)], . . .
    [r2start(:); r2(:); r2tail(:)], . . .
    freq_grid, r2_0, r2_infty);
r2 = min(r2max,max(r2,r2min));
    % Step 32 is performed as follows:
[hopt, fg2, normHankel] = NehariInterp(center, r2, freq_grid, InterpData);
    % Step 34 is performed as follows:
    while normHankel > 1,
    %-------------begin Nehari computation loop---------------------------------
    end           % while loop
    %-------------end Nehari computation loop---------------------------------
    % Step 36 is performed as follows:
F = F + Fstep;
%=====================================================
    % The subroutine function jwgrid of Nfopt may be calculated as follows:
function [omega, theta, eitheta] = jwgrid(Nsmps, alpha)
%=====================================================
%function [omega, theta, eitheta] = jwgrid(Nsmps, alpha)
%
%JWGRID computes a grid on the j-omega axis corresponding
%    to the roots of unity in the z-plane.
%    The LFT which it is based on is
%        z = (s − alpha) / (s + alpha).
%    Here s = sigma + j*omega.
%
%INPUT: Nsmps -- # of sample points on the positive j-omega
%       axis. This should be a power of 2.
%       alpha -- a positive real scaling parameter.
%OUTPUT: omega -- values(increasing) on the positive j-omega axis.
%        theta -- values in radians corresponding to omega.
%        eitheta -- values on |z|=1 corresponding to omega.
%
%=====================================================
theta = 0:(pi/Nsmps):pi; theta = theta(:);
theta = theta(2:Nsmps+1);
eitheta = exp(i*theta);
omega = alpha*cot(theta/2);
omega = flipud(omega);         % order by increasing value
theta = flipud(theta); % order to correspond to increasing omega
eitheta = flipud(eitheta);     % order to correspond to increasing omega
z = (i*omega − alpha) ./ (i*omega + alpha);
z = flipud(z);       % order by increasing angle
zconj = conj(flipud(z));
Z = [1; z; zconj(2:Nsmps)];    % samples on unit circle
    % The subroutine function StepSpline of Nfopt may be calculated as
follows:
function h = StepSpline(f0,f1,f,iupdwn)
%----------------------------------------------------------------
```

-continued

```
% function h = StepSpline(f0,f1,f,iupdwn)
% StepSpline interpolates and extrapolates to give a rounded unit step function.
% iupdwn = 'up' for step up; 'down' for step down.
% Input: 0 <= f0 < f1 and f real.
%------------------------------------------------------------------
h = zeros(size(f));
hslope = .25;         % option: atanh(.5)
i0 = find(f <= f0);
i1 = find(f >= f1);
i01 = find(f > f0 & f < f1);
switch iupdwn
case 'up'
h(i0) = 0;
h(i1) = 1;
h(i01) = tanh(hslope*(f(i01) − f0)./(f1 − f(i01)));
case 'down'
h(i0) = 1;
h(i1) = 0;
h(i01) = tanh(.25*(f1 − f(i01))./(f(i01) − f0));
end
%=========================================================
       % The subroutine function InExSpline of Nfopt may be calculated as
follows:
function h = InExSpline(f_data,h_data,f,hlb,hub)
%=========================================================
% Interpolate Extrapolate Spline: h = InExSpline(f_data,h_data,f)
%
% The frequency and function data points are listed in the vectors f_data
% and h_data. The user-specified sample frequencies in f are splined to
% give an estimate of h(f). Frequencies exterior to the spline interval
% are extrapolated to hlb for f < min(f_data) and hub for f > max(f_data).
%
%=========================================================
% Size the inputs
f = f(:);
f_data = f_data(:);
h_data = h_data(:);
% Determine the frequency interval
f_min = min(f_data);
f_max = max(f_data);
% Spline the data. spline can extrapolate, so this entire function is optional.
index = find(f_min <= f & f <= f_max);
h = spline(f_data, h_data, f(index));
index = find(f < f_min);
h = [hlb*ones(length(index),1); h];
index = find(f > f_max);
h = [h; hub*ones(length(index),1)];
%=========================================================
       % The subroutine function NehariInterp of Nfopt may be calculated as
follows:
function [h,freq_grid,normHankel] = NehariInterp(c,r2,freqgrid,InterpData)
%=========================================================
% function [h,freq_grid,normHankel] = NehariInterp(c,r2,freq_grid,InterpData)
% NehariInterp -- Nehari Interpolation
% Given a center function c and radius squared r2
% Generates a center-function data set and then an Hoo approximation to it.
% Utilizes NewtonInterp.m, wilsonsf.m and NehariD.m
%
% INPUT: c -- center function defined on j*freq_grid
%    r2 -- radius squared defined on j*freq_grid
%    freq_grid -- spacing of points along the imaginary axis corresponding
%       to equal spacing on the circle.
%    InterpData -- is the table of interpolation data that the
%         Hoo approximant is to interpolate.
%
% OUTPUT: h -- the values of the Hoo approximant on freqi_grid.
%    freq_grid -- frequency grid of the output value(same as input).
%       normHankel -- norm of Hankel matrix used in constructing h.
%
%=========================================================
Nfc = length(c);
% Interp points
freqfix = real(InterpData(:,1));
cfix = InterpData(:,2);
Ninterps = length(freqfix);
% Construct Hoo zero-interpolant.
tab = [i*freqfix(:) zeros(size(freqfix))];
tab = [tab; i*max(freq_grid) 0];
tab = [tab; conj(tab)];
```

-continued

```
apole = -20;
h0 = NewtonInterp(tab, i*freq_grid, apole);
% Construct Hoo interpolant for data
tab = [i*freqfix(:) cfix(:)];
tab = [tab; i*max(freq_grid) 0];
tab = [tab; conj(tab)];
apole = -20;
h1 = NewtonInterp(tab, i*freq_grid, apole);
% Define radius^2 function, r2, and obtain spectral factor, OuterR.
r22 = [r2(Nfc); r2(Nfc:-1:1); conj(r2(1:(Nfc-1)))];
[OuterRR,ErrSF] = wilsonsf(r22, 100*eps);
OuterR = OuterRR((Nfc+1):-1:2);
% Create interpolation center function
k = (c - h1) ./ OuterR;    % Best data-generated center ftn
% Define center function for HAPPROX
% Fill accoring to z = (j*omega - 1)/(j*omega + 1).
k = [0; k(Nfc:-1:1); conj(k(1:(Nfc-1)))];
% Obtain best Hoo approximation to k.
[hdrp, normHankel, kcomp] = NehariD(k, 1);
hdr = hdrp((Nfc+1):-1:2);
% Multiply by spectral factor to obtain solution of disk problem.
h = h1 + OuterR.*hdr;
% ------ End of computations.
    % The subroutine function NewtonInterp of NehariInterp may be
calculated as follows:
function [y,c] = NewtonInterp(tab,z,apole);
%=========================================================
% [y,c] = NewtonInterp(tab,z,apole);
%
% Newton Interpolation: Implementation of an RHP Hoo interpolation scheme.
% The user chooses the single pole location. It's order is determined by
% the number of interpolation points.
%
% INPUTS: tab -- N-by-2 matrix of the support points (x_n,t_n).
%     z -- points to be evaluated at
%     apole - location of pole. Assumed to be real and < 0.
% OUTPUT: y -- the value of the interpolant at z.
%     c -- coefficients of the non-zero Newton Interpolant.
%
% This function requires the m-file "InterpCoeffs".
%
% Test Case: x=i*[1 3 5]; t=[6 8 10]; z=i*(0:6); apole=-2; tab=[x.'t];
%
%=========================================================
if nargin < 3,
POLE = -20;
else
POLE = -abs(apole);
end;
z = z(:);
Npts = length(z);
% Size the support points
[N,M] = size(tab);
% Load the T-tableau
t = tab(:,2);
% Pull-off the support absiccas
x = tab(:,1);
%Xz = [ones(Npts,1), (z*ones(1,N) - ones(Npts,1)*x.') ./ (z-POLE)*ones(1,N)];
Xz1 = z*ones(1,N) - ones(Npts,1)*x.';
Xz2 = (z-POLE)*ones(1,N);
Xz = [ones(Npts,1), Xz1 ./ Xz2];
if any(t) ~= 0,
c = InterpCoeffs(x, t, POLE);
y = c(1) * ones(Npts,1);
for i1 = 2:N,
y = y + c(i1)*prod(Xz(:,1:i1).').';
end;      % i1 loop
else
y = prod(Xz.').';
end
%=========================================================
    % The subroutine function wilsonsf of NehariInterp may be calculated as
follows:
function [OuterR] = wilsonsf(r,tol);
%=========================================================
% A MATLAB version of WilsonSF
%
% OuterR = exp(hilbert(log(max(r,tol))/2));
%=========================================================
```

```
% Set the positivity tolerance
if nargin <= 1; tol = eps; end
% Ask that the data vector "obey" the outer function formula
OuterR = exp(hilbert(log(max(r,tol))/2)); end
%=========================================================
      % The subroutine function NehariD of NehariInterp may be calculated as
follows:
function [H, normHankel, Kcomp] = NehariD(K, iTest)
%=========================================================
%function [H, normHankel, Kcomp] = NehariD(K, iTest)
%
% NehariD calculates the best H-infinity approximation H to a continuous
%    vector-valued function K of dimension Ndim sampled on |z|=1 at equal spacing.
%    zgrid := exp(i*2*pi * (0:(Npts-1)) / Npts)
%    K and H are assumed sampled on zgrid.
%
% INPUT:
%    K -- Npts by Ndim matrix of the target function evaluated on zgrid.
%        Best to make Npts be a power of 2.
%    iTest -- Setting iTest=1 produces error plots.
%
% OUTPUT:
%    H -- Npts by Ndim matrix of values of H on zgrid.
%    normHankel -- the distance from K to H-infinity.
% Kcomp -- Npts by Ndim matrix of 'correction' values to K on zgrid.
%        K - H = Kcomp
%
% NOTES:
%    Best H-infinity approx to K is given by K - Kcomp.
%    Magnitude of Kcomp should be constant:
%    sum(abs(Kcomp').^2) = normHankel^2
%
%=========================================================
[Npts,Ndim] = size(K);
if Npts==1, K=K.'; end
[Npts,Ndim] = size(K);
Nfc = 2^nextpow2(Npts);
if Nfc ~= Npts, error('STOP: # of pts of K not a power of 2'), end
Nnfc = Nfc / 2;
z = exp(i*2*pi*(0:(Nfc-1))/Nfc).';
H = zeros(Nfc,Ndim);
Kcomp = zeros(Nfc,Ndim);
Kfc = fft(K, Nfc) / Nfc;
Knfc = Kfc(Nfc:-1:(1+Nnfc),:);
% Form Hankel matrix for symbol K.
HankelK = zeros(Ndim*Nnfc,Nnfc);
for idim = 1:Ndim
  irange = (idim-1)*Nnfc + [1:Nnfc];
  HankelK(irange,:) = hankel(Knfc(:,idim));
end;         % loop over idim
% Obtain largest singular value and corresponding vectors for Hankel.
[U,S,V] = svd(HankelK, 0);
normHankel = S(1,1);
SingVals = diag(S);
fz = polyval(V(Nnfc:-1:1,1), z);
% Compute error complement of K on z.
for idim = 1:Ndim
  irange = (idim-1)*Nnfc + [Nnfc:-1:1];
  Kcomp(:,idim) = S(1,1)*polyval([U(irange,1); 0],conj(z)) ./ fz;
  H(:,idim) = K(:,idim) - Kcomp(:,idim);
end;
%-------------End of Nehari Computation--------------------------------
      % The subroutine function InterpCoeffs of NewtonInterp may be
calculated as follows:
function [c] = InterpCoeffs(s, v, apole);
%=========================================================
%function [c] = InterpCoeffs(s, v, apole);
% InterpCoeffs computes coefficients for Newton Interpolation scheme.
% It is called by "NewtonInterp".
%
% INPUTS: s -- points to be interpolated at
%    v -- values to be assumed at corresponding points in s.
%    apole -- location of pole in rational interpolant.
%    Note: apole < 0 and Real.
% OUTPUT: c -- coefficients of the Newton Interpolant.
%
%=========================================================
s = s(:); v = v(:); apole = -abs(apole);
if length(s) ~= length(v), error('Input vectors differ in length'), end
```

-continued

```
Ncoeffs = length(s);
A = [ones(Ncoeffs,1) zeros(Ncoeffs, Ncoeffs-1)];
for i1 = 2:Ncoeffs
Row = (s(i1)*ones(1,i1-1) - s(1:(i1-1)).') / (s(i1)-apole);
for j1 = 2:i1
A(i1,j1) = prod(Row(1:(j1-1)));
end        %j1 loop
end        % i1 loop
c = A \v;
%=========================================================
```

The search for the greatest lower bound noise factor F attainable is terminated when the Hankel norm ///Hk/// is returned with a value less than one.

For the example given, the output of NFopt is F=1.209 as the greatest lower bound obtainable by a matching circuit connecting a 50 Ohm source to the NEC amplifier described.

Obviously, many modifications and variations of the invention are possible in light of the above description. It is therefore to be understood that within the scope of the claims the invention may be practiced otherwise than as specifically described.

What is claimed is:

1. A method for calculating an amplifier's greatest lower bound of noise figure pertaining uniformly over an operating band of said amplifier comprising the following steps:
(a) inputting minimum noise figure values Fmin and inputting frequency values freq corresponding to said minimum noise figure values Fmin, inputting source reflectance values sOpts, which are source reflectance values for achieving said minimum noise figure at said corresponding frequency values freq, and inputting noise resistance values RNZO which are noise resistance values with zero reflectance for said frequency values freq;
(b) initializing a proposed minimal attainable noise figure F;
(c) computing a center function center from said Fmin, sOpt, and RNZ0 values;
(d) computing a radius function r2 from said Fmin, sOpt, and RNZ0 values;
(e) selecting interpolation points InterpData from maximum Fmin values;
(f) resampling center and r2 over a defined frequency grid;
(g) extrapolating said resampled center and said resampled r2 to smooth end points;
(h) extending said extrapolated and smoothed center and said extrapolated and smoothed r2 to negative frequencies;
(i) computing an ///Hk/// indicator corresponding to said proposed minimal attainable noise figure F;
(j) determining whether said proposed minimal attainable noise figure F is attainable from said ///Hk/// indicator;
(k) incrementing said proposed minimal attainable noise figure F and continuing from step (c) if proposed minimal attainable noise figure F is not attainable in step (j); and
(l) outputting proposed minimal attainable noise figure F once attainable from said ///Hk/// indicator,
wherein said outputted proposed minimal attainable noise figure F is equated with said greatest lower bound of noise figure.

2. The method of claim 1 wherein said amplifier is a wide-band amplifier.

3. The method of claim 2 wherein said wide-band amplifier is a two-port amplifier.

4. A computer program product comprising:
a computer useable medium for embodying a computer program for input to a computer;
and a computer program embodied in said medium for coupling to the computer to calculate an amplifier's greatest lower bound of noise figure pertaining uniformly over an operating band of said amplifier by performing the following functions:
(a) inputting minimum noise figure values Fmin and inputting frequency values freq corresponding to said minimum noise figure values Fmin, inputting source reflectance values sOpts, which are source reflectance values for achieving said minimum noise figure at said corresponding frequency values freq, and inputting noise resistance values RNZO which are noise resistance values with zero reflectance for said frequency values freq;
(b) initializing a proposed minimal attainable noise figure F;
(c) computing a center function center from said Fmin, sOpt, and RNZ0 values;
(d) computing a radius function r2 from said Fmin, sOpt, and RNZ0 values;
(e) selecting interpolation points InterpData from maximum Fmin values;
(f) resampling center and r2 over a defined frequency grid;
(g) extrapolating said resampled center and said resampled r2 to smooth end points;
(h) extending said extrapolated and smoothed center and said extrapolated and smoothed r2 to negative frequencies;
(i) computing an ///Hk/// indicator corresponding to said proposed minimal attainable noise figure F;
(j) determining whether said proposed minimal attainable noise figure F is attainable from said ///Hk/// indicator;
(k) incrementing said proposed minimal attainable noise figure F and continuing from step (c) if proposed minimal attainable noise figure F is not attainable in step (j); and
(l) outputting proposed minimal attainable noise figure F once attainable from said ///Hk/// indicator,
wherein said outputted proposed minimal attainable noise figure F is equated with said greatest lower bound of noise figure.

5. The method of claim 4 wherein said amplifier is a wide-band amplifier.

6. The method of claim 5 wherein said wide-band amplifier is a two-port amplifier.

7. The computer program product of claim 4 wherein said outputted proposed minimal attainable noise figure F is calculated substantially by the following:

```
    [freq, f0, Fmin, sOpt, RNZ0];
Nf = length(freq);
disp(['Number of frequency samples =', num2str(Nf)])
Nso = 256;
Nsmps_out = input(['Enter number of samples to compute, default = ',int2str(Nso),' > ']);
if isempty(Nsmps_out), Nsmps_out = Nso; end
Nfc = 2^nextpow2(Nsmps_out);
F0inc = 0.002       Fstep = 0.001;
F = max(Fmin) + F0inc;
normHankel = 1111;
[freq_grid] = jwgrid(Nfc, freq(end));
Nfp = ((F − Fmin) ./ (4*RNZ0)) .* abs(1 + sOpt).^2;
center = sOpt ./ (1 + Nfp);
center = center(ifreq);
Nfp = ((F − Fmin) ./ (4*RNZ0)) .* abs(1 + sOpt).^2;
r2 = (Nfp.*(Nfp + 1 − abs(sOpt).^2)) ./ (1 + Nfp).^2;
r2 = r2(ifreq);
imin = find(r2 == min(r2));
InterpData = [freq(imin) center(imin)];
cmax = 0.99; c0 = 0;
fstart = freq_grid(find(freq_grid < freq(1)));
ftail = freq_grid(find(freq_grid > freq(end)));
Ntail = length(ftail);
Ntailstep = ceil(min(20,.1*Ntail));
cstart = c0+(center(1)−c0)*StepSpline(fstart(1),fstart(end),fstart,'up');
ctail = c0 + (center(end) − c0)* . . .
    StepSpline(ftail(fix(Ntailstep/4)),ftail(2*Ntailstep),ftail,'down');
center = InExSpline(. . .
    [fstart; freq; ftail], . . .
    [cstart; center; ctail], freq_grid, 0, 0);
ic = find(abs(center) > cmax);
center(ic) = cmax * center(ic) ./ abs(center(ic));
r2min = min(r2);
r2max = .99;
Nsteps = nextpow2(Nsmps_out);
r2_0 = r2max; r2_infty = r2max;
r2ave1 = (r2_0 + r2(1))/2; r2ave2 = (r2_infty + r2(end))/2;
finc = .1*min(diff(freq));
Ntflat = Nsteps;
r2tail = r2(end)+(r2_infty − r2(end))* . . .
    StepSpline(ftail(fix(Ntailstep/4)),ftail(2*Ntailstep),ftail,'up');
Nsflat = min(length(fstart)−1,Nsteps);
r2start = r2(1)+(r2_0 −
r2(1))*StepSpline(fstart(1),fstart(end),fstart,'down');
r2 = InExSpline(. . .
    [fstart(:);freq;ftail(:)],
    [r2start(:); r2(:); r2tail(:)],
    freq_grid, r2_0, r2_infty);
r2 = min(r2max,max(r2,r2min));
[hopt, fg2, normHankel] = NehariInterp(center, r2, freq_grid, InterpData);
while normHankel > 1,
end
    F = F + Fstep;
    wherein the function jwgrid is calculated as follows:
function [omega, theta, eitheta] = jwgrid(Nsmps, alpha)
theta = 0:(pi/Nsmps):pi; theta = theta(:);
theta = theta(2:Nsmps+1);
eitheta = exp(I*theta);
omega = alpha*cot(theta/2);
omega = flipud(omega);
theta = flipud(theta);
eitheta = flipud(eitheta);
z = (I*omega − alpha) ./ (I*omega + alpha);
z = flipud(z);
zconj = conj(flipud(z));
Z = [1; z; zconj(2:Nsmps)];
    wherein the function StepSpline is calculated as follows:
function h = StepSpline(f0,f1,f,iupdwn)
h = zeros(size(f));
hslope = .25;
i0 = find(f <= f0);
i1 = find(f >= f1);
i01 = find(f > f0 & f < f1);
switch iupdwn
```

-continued

```
case 'up'
    h(i0) = 0;
    h(i1) = 1;
    h(i01) = tanh(hslope*(f(i01) − f0)./(f1 − f(i01)));
case 'down'
    h(i0) = 1;
    h(i1) = 0;
    h(i01) = tanh(.25*(f1 − f(i01))./(f(i01) − f0));
end
    wherein the function InExSpline is be calculated as follows:
function h = InExSpline(f_data,h_data,f,hlb,hub)
f = f(:);
f_data = f_data(:);
h_data = h_data(:);
f_min = min(f_data);
f_max = max(f_data);
index = find(f_min <= f & f <= f_max);
h = spline(f_data, h_data, f(index));
index = find(f < f_min);
h = [hlb*ones(length(index),1);h];
index = find(f > f_max);
h = [h; hub*ones(length(index),1)];
    wherein the function NehariInterp is calculated as follows:
function [h,freq_grid,normHankel] =
NehariInterp(c,r2,freq_grid,InterpData)
Nfc = length(c);
freqfix = real(InterpData(:,1));
cfix = InterpData(:,2);
Ninterps = length(freqfix);
tab = [I*freqfix(:) zeros(size(freqfix))];
tab = [tab; I*max(freq_grid) 0];
tab = [tab; conj(tab)];
apole = −20;
h0 = NewtonInterp(tab, I*freq_grid, apole);
tab = [I*freqfix(:) cfix(:)];
tab = [tab; I*max(freq_grid) 0];
tab = [tab; conj(tab)];
apole = −20;
h1 = NewtonInterp(tab, I*freq_grid, apole);
r22 = [r2(Nfc); r2(Nfc:−1:1); conj(r2(1:(Nfc−1)))];
[OuterRR,ErrSF] = wilsonsf(r22, 100*eps);
OuterR = OuterRR((Nfc+1):−1:2);
k = (c − h1) ./ OuterR;
k = [0; k(Nfc:−1:1); conj(k(1:(Nfc−1)))];
[hdrp, normHankel, kcomp] = NehariD(k, 1);
hdr = hdrp((Nfc+1):−1:2);
h = h1 + OuterR.*hdr;
    wherein the function NewtonInterp is calculated as follows:
function [y,c] = NewtonInterp(tab,z,apole);
if nargin < 3,
    POLE = −20;
else
    POLE = −abs(apole);
end;
z = z(:);
Npts = length(z);
[N,M] = size(tab);
t = tab(:,2);
x = tab(:,1);
Xz1 = z*ones(1,N) − ones(Npts,1)*x.';
Xz2 = (z−POLE)*ones(1,N);
Xz = [ones(Npts,1), Xz1 ./ Xz2];
if any(t) ~= 0,
    c = InterpCoeffs(x, t, POLE);
    y = c(1) * ones(Npts,1);
    for i1 = 2:N,
        y = y + c(i1)*prod(Xz(:,1:i1).').';
    end;       % i1 loop
else
    y = prod(Xz.').';
end
    wherein the function wilsonsf is calculated as follows:
function [OuterR] = wilsonsf(r,tol);
if nargin <= 1; tol = eps; end
OuterR = exp(hilbert(log(max(r,tol))/2); end
    wherein the function NehariD is calculated as follows:
function [H, normHankel, Kcomp] = NehariD(K, iTest)
[Npts,Ndim] = size(K);
if Npts==1, K=K.'; end
```

```
[Npts,Ndim] = size(K);
Nfc = 2^nextpow2(Npts);
if Nfc ~= Npts, error('STOP: # of pts of K not a power of 2'), end
Nnfc = Nfc / 2;
z = exp(i*2*pi*(0:(Nfc-1))/Nfc).';
H = zeros(Nfc,Ndim);
Kcomp = zeros(Nfc,Ndim);
Kfc = fft(K, Nfc) / Nfc;
Knfc = Kfc(Nfc:-1:(1+Nnfc),:);
HankelK = zeros(Ndim*Nnfc,Nnfc);
for idim = 1:Ndim
  irange = (idim-1)*Nnfc + [1:Nnfc];
  HankelK(irange,:) = hankel(Knfc(:,idim));
end;
[U,S,V] = svd(HankelK, 0);
normHankel = S(1,1);
SingVals = diag(S);
fz = polyval(V(Nnfc:-1:1,1), z);
for idim = 1:Ndim
  irange = (idim-1)*Nnfc + [Nnfc:-1:1];
  Kcomp(:,idim) = S(1,1)*polyval([U(irange,1); 0],conj(z)) ./ fz;
  H(:,idim) = K(:,idim) - Kcomp(:,idim);
end;
```

```
wherein the function InterpCoeffs is calculated as follows:
function [c]= InterpCoeffs(s, v, apole);
s = s(:); v = v(:); apole = -abs(apole);
if length(s) ~= length(v), error('Input vectors differ in length'), end
Ncoeffs = length(s);
A = [ones(Ncoeffs,1) zeros(Ncoeffs, Ncoeffs-1)];
for i1 = 2:Ncoeffs
Row = (s(i1)*ones(1,i1-1) - s(1:(i1-1)).') / (s(i1)-apole);
  for j1 = 2:i1
  A(i1,j1) = prod(Row(1:(j1-1)));
  end
end
c = A \v;
``` wherein said outputted proposed minimal attainable noise figure F is equated with the greatest lower bound of noise figure.

* * * * *